United States Patent

Nadeau

[11] 3,962,633
[45] June 8, 1976

[54] LONG-SCALE METER MOVEMENT HAVING A ONE-PIECE OUTER POLE AND RETURN RING, AND A DEMOUNTABLE SUBASSEMBLY THEREIN COMPRISING MAGNET, CENTRAL CORE, MOVING COIL AND SUPPORT FRAME

[75] Inventor: Francis R. Nadeau, Penacook, N.H.

[73] Assignee: Hoyt Electrical Instrument Works, Inc., Penacook, N.H.

[22] Filed: Jan. 20, 1975

[21] Appl. No.: 542,437

[52] U.S. Cl. .................. 324/150; 324/151 R
[51] Int. Cl.² ............. G01R 1/20; G01R 1/02
[58] Field of Search ............ 324/150, 151 R, 151 A, 324/154, 146

[56] References Cited
UNITED STATES PATENTS

| | | | |
|---|---|---|---|
| 2,848,662 | 8/1958 | Barry et al. | 324/150 X |
| 2,887,656 | 5/1959 | Barry et al. | 324/150 |
| 3,004,222 | 10/1961 | Knudsen | 324/150 |
| 3,237,103 | 2/1966 | Kunz et al. | 324/150 |
| 3,684,959 | 8/1972 | Spira et al. | 324/151 R |
| 3,713,024 | 1/1973 | Banus | 324/154 X |
| 3,882,389 | 5/1975 | Pearson | 324/151 A |

*Primary Examiner*—Gerard R. Strecker
*Attorney, Agent, or Firm*—Kenway & Jenney

[57] ABSTRACT

A long-scale meter movement of the type in which one leg of the moving coil operates within an annular gap between an outer pole and a cylindrical core. In the new meter movement, the outer pole is integral with the return ring, in a generally circular configuration. The coil support frame is likewise of unitary construction, with a central portion extending through the return ring in the region of the magnet block and having integral coil pivot supports front and rear. The central frame portion has an aperture for the magnet block, with separate supports for the core extending through the aperture in interlocking relation with the frame. The construction of the parts is such that the frame, coil, core and magnet may be fitted together to form a subassembly which is inserted as a unit into the one-piece outer pole and return ring.

7 Claims, 8 Drawing Figures

U.S. Patent   June 8, 1976   3,962,633
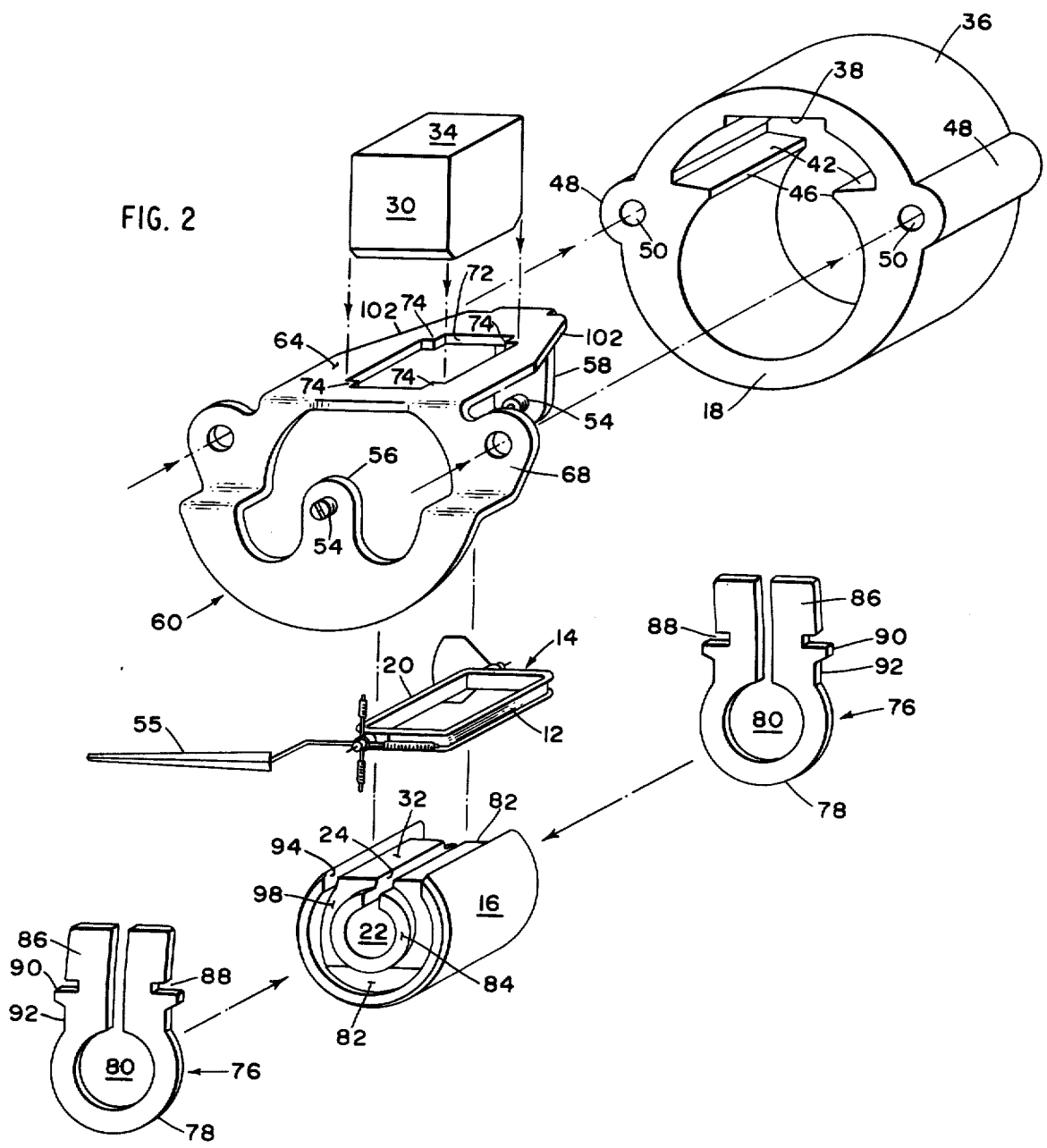

3,962,633

LONG-SCALE METER MOVEMENT HAVING A ONE-PIECE OUTER POLE AND RETURN RING, AND A DEMOUNTABLE SUBASSEMBLY THEREIN COMPRISING MAGNET, CENTRAL CORE, MOVING COIL AND SUPPORT FRAME

SUMMARY OF THE INVENTION

Long-scale meter movements are customarily provided by employing concentric pole pieces to define a narrow annular slot of more than 180°, with the flux across the gap provided by a rectangular magnet block. One leg of the moving coil rotates within a central passage in the cylindrical core, with an access slot in the region of the core not traversed by the other leg of the coil moving around the annular gap.

This general configuration does not lend itself to convenient construction and assembly. One form of construction employs a two-piece outer pole and return ring assembly, in order to permit use of a one-piece frame for supporting the coil, core and magnet. Alternatively, if the outer pole and return ring are of one-piece construction, this introduces complications in the construction and assembly of the support frame for the coil pivots, the central core and the magnet. Still another possibility is to utilize adhesive to secure parts temporarily held in a jig, but this renders disassembly for repair impractical.

In the present invention, a unitary outer pole and return ring structure of relatively simple configuration is made possible, along with a support frame construction which permits the pre-assembly of coil, core and magent into a unit which can be slid into the one-piece outer pole and return ring and retained therein in firm frictional engagement while this movement is mounted in the usual case.

More particularly, the present invention, by its special form of center core supporting means and related features, makes possible the utilization of both the unitary outer pole and return ring structure, as well as a simple one-piece coil support frame, while providing simple, accurate assembly of the parts.

DESCRIPTION OF THE DRAWINGS

FIG. 1 is a view in front elevation of the assembled meter movement;

FIG. 2 is an exploded view showing the principal components of the meter movement in an arrangement illustrative of the manner of assembly;

DESCRIPTION OF PREFERRED EMBODIMENT OF THE INVENTION

Figure 3:
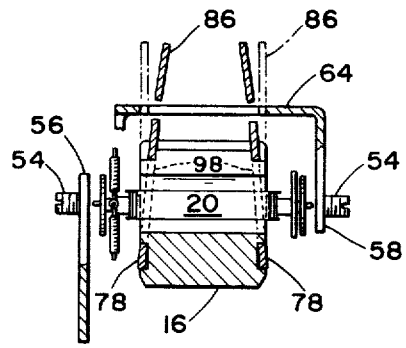
FIG. 3 is a sectional view in side elevation showing the parts at one stage in the assembly.
Figure 4:
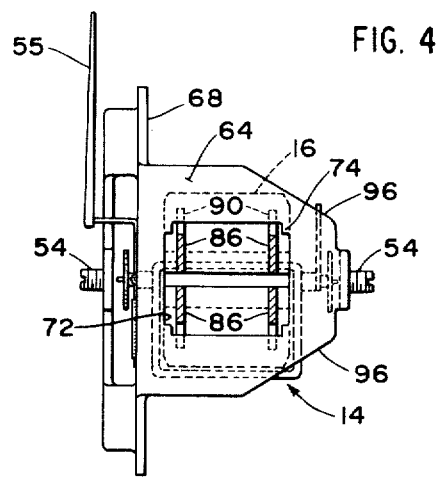
FIG. 4 is a top plan view, partly in section, showing the parts at approximately the stage as in FIG. 3.

The meter movement illustrated in the drawings is a long-scale moving coil instrument in which one leg 12 of the coil 14 operates within an annular gap between a cylindrical inner iron core 16 and an outer iron pole 18. The other leg 20 of the coil rotates within a central passage 22 in the core. A slot 24 permits the leg 20 to be passed into the passage during assembly.

The magnetic flux across the annular gap is provided by a magnet block 30, the lower pole of which is in contact with the flattened region 32 on the top of the core 16, being laterally centered thereon by the upwardly extending surfaces 94. Preferably this flattened area is slightly recessed below the periphery of the core to aid in positioning the magnet.

The upper pole 34 of the magnet is in flux communication with the outer pole 18 by way of a return ring region 36 having a flattened interior surface 38. In the illustrative embodiment the outer pole and return ring are of one piece construction of generally circular configuration, readily fabricated by sintered metal procedures. The inner surface of the outer pole region is cylindrical and occupies an arc substantially in excess of 180°. In the return ring region, the interior is formed with gradually increasing clearance from the magnet seat downwardly, terminating in inwardly extending shoulders 42 at the terminations 46 of the outer pole. The tops of these shoulders are tilted downwardly at a slight angle to the horizontal, for a purpose to be described later. To provide for securing a meter movement assembly within the usual case, enlargements 48 on the periphery of the outer pole permit front to back passages 50 for the mounting screws 52.

The moving coil, with its indicator 55, is of conventional construction and is pivotally supported on the customary bearings 54 threaded into front and rear portions 56 and 58 of support frame 60. This frame is formed of one piece of material such as brass, having the integral front and rear coil supports connected to the horizontal side members 64 which, in the assembled movement, extends through the return ring in the region of the shoulders 42. The frame includes a front mounting flange 68 having a configuration corresponding to the end of the outer pole in the region of the enlargements 48 through which the mounting screws 52 are passed.

The central horizontal region 64 of the frame is provided with an aperture of a size to receive the lower end of the magnet block in the assembled structure. In addition, the aperture in the frame at the front and rear includes shallow extensions 72, slightly narrower than the magnet block, to provide small reentrant corners 74. The purpose of the extensions in the magnet aperture is to receive the upper ends of the front and rear supports for the cylindrical core. These supports 76 comprise a rounded lower end 78 having a circular aperture 80 concentric therewith. The core ends are formed with annular recesses 82 into which the lower ends of the core supports fit, with the circular shoulders 84 of the core ends fitting into the support apertures 80. The upper ends 86 of the core supports are divided by slots extending to the apertures to provide access for the center leg 20 of the coil. At a carefully predetermined height above the center of the core-receiving apertures 80, the sides of the supports are formed with slots 88, below which the core supports have projecting shoulders 90.

The assembly of the meter movement proceeds in simple step by step fashion. The lower ends of the core supports 76 are positioned over the ends of the core with correct alignment of the access slots maintained as a result of contact between the sides 92 of the core supports and the surfaces 94 which permit entry of the core supports at the ends of the core. The coil, in a horizontal position, is then lowered into the core with the center leg passing through slot 24 into the core center 22.

The frame 60, with the coil bearings 54 retracted to clear the coil pivots, is now lowered into place over the core supports. To permit the upper ends of the supports to enter the magnet aperture in the frame in the region of the full-width magnet-receiving opening, the annular recessed regions 82 of the core ends are provided with an inwardly sloping region 98 which allows the core supports to tilt inwardly, as shown in FIG. 3 by the full-line sectioning of the ends 86. Thus, the ends 86 are clear of the reentrant corners 74 of the aperture.

The sides 64 of the frame 60 adjacent the magnet aperture now rest upon the shoulders 90 of the core supports. This brings the slots 88 into horizontal alignment with the corners 74 so that the corners enter the slots when the tops of the core supports are moved apart into vertical position (see dotted outline of core support ends in FIG. 3). The core supports are now positioned in interlocking relation with the frame, with the core accurately held in proper relation to the frame front and rear.

Figure 5:
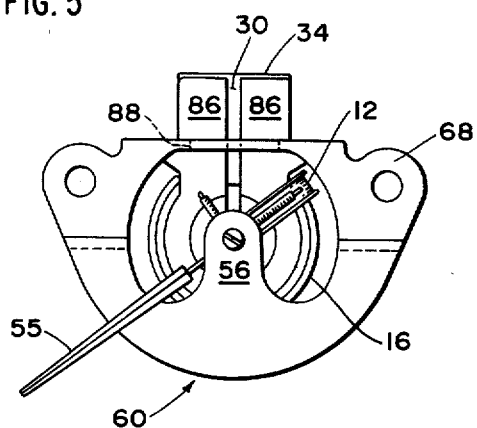
FIG. 5 is a view in front elevation showing portion of the meter movement illustrated in FIGS. 3 and 4, with the magnet added, prior to assembly with the outer pole and return ring.
Figure 6:
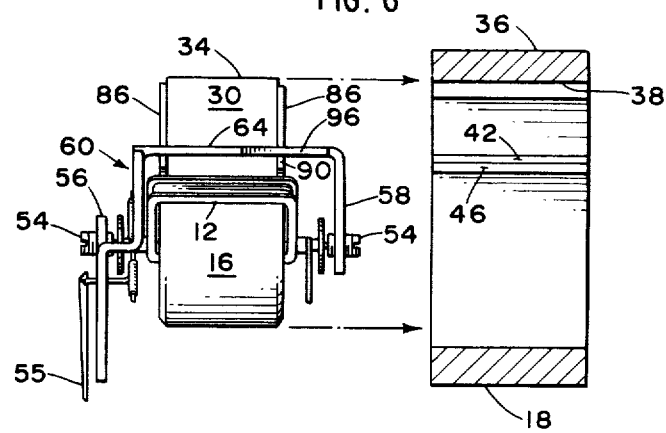
FIG. 6 is a view in side elevation, showing at the left the subassembly as shown in FIG. 5 and at the right, in section, the outer pole and return ring in aligned position to receive the movement.

The next step is the assembly of the magnet block 30 within the aperture in the frame, with the lower pole face resting on the recessed top surface 32 of the cylindrical core 16. The front and rear walls of the magnet pass down between the upstanding ends 86 of the core supports, providing additional front end positioning of the magnet against displacement and insuring that the core supports cannot tilt inward out of interlocking relation with the frame, as shown in FIGS. 5 and 6. Preferably the tops of the core supports are formed with a slight inward bowing or bend relative to the lower portion below the shoulders 90 (best shown in FIG. 2). The bowing should be sufficient to require some force to insert the magnet, thereby providing firm frictional engagement between the tops 86 of the supports and the magnet, as well as snug contact between the lower ends and the core 16.

The coil may now be floated in the frame by adjusting the bearings 54 inwardly into proper relation with the coil pivots. There now exists a subassembly comprising the frame and moving coil mounted therein, together with the cylindrical core and magnet, with the magnet block insuring that the core will not become displaced through disconnection of the core supports from the frame. It is now a simple matter to slide this subassembly into the outer pole and return ring structure, as illustrated in FIG. 6. The top of the magnet slides into engagement with the interior flat surface 38 of the return ring, while the horizontal portion 64 of the frame enters the wider opening above the outer pole. The oblique margins 102 of the rear portion of the frame aid this sliding assembly of the parts.

Figure 7:
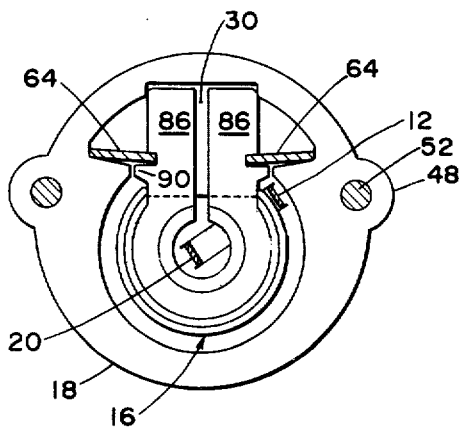
FIG. 7 is a simplified view in front elevation, partly in section, showing in the assembled movement the relationship of the parts in the vicinity of the core supports.
Figure 8:
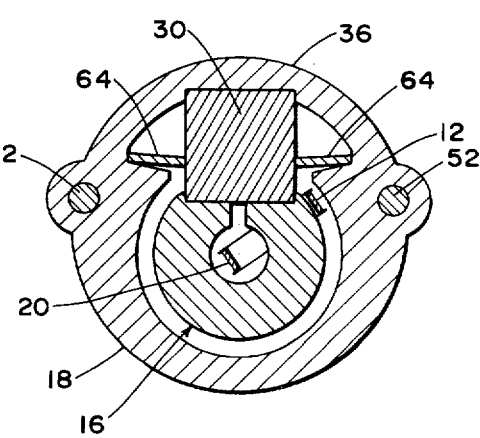
FIG. 8 is also a simplified view in front elevation, in full section in order to show the relation of the parts within the central region of the assembly.

FIGS. 7 and 8 illustrate a further feature of the invention. By reason of the slight downward tilt of the upper surfaces of the shoulders 42 at the termination of the outer pole, clearance is provided below the inner margins of the frame 64 in the region of the magnet aperture. As a result, the portions of the shoulders which are contacted by the outer side margins of the frame may be at a height, in relation to the slots 88 in the sides of the core support, to require a slight torsional twisting of the frame portions 64 extending from front to back alongside the magnet when the subassembly is inserted in the combined outer pole and return ring. This serves to retain the subassembly in secure frictional engagement with the outer pole and return ring, with firm contact between the pole faces of the magnet and the seating surfaces on return ring and core.

The assembled meter movement may now be adjusted and tested and, if necessary, readily disassembled for repair if, for example, the coil is found to need replacement.

In view of the above it will be seen that the invention provides a construction in which the parts assemble into accurate predetermined relationship as a result of their configuration, and not in reliance on jigs or fixtures to establish critical alignment in the finished instrument.

It is to be understood that the invention is not limited in its application to the details of construction and arrangement of parts illustrated in the accompanying drawings, since the invention is capable of other embodiments and of being practiced or carried out in various ways. Also, it is to be understood that the phraseology or terminology employed herein is for the purpose of description and not of limitation.

As many changes could be made in the above constructions without departing from the scope of the invention, it is intended that all matter contained in the above description or shown in the accompanying drawings, shall be interpreted as illustrative and not in a limiting sense, and it is also intended that the appended claims shall cover all such equivalent variations as come within the true spirit and scope of the invention.

Having described the invention, what is claimed is:

1. A long-scale meter movement of the moving coil type in which one leg of the coil operates within an annular magnetic gap between concentric pole faces and another leg of the coil extends through a central passage in the inner core piece, comprising a block magnet, an outer ring member having an outer pole piece and a return ring portion in a unitary generally circular configuration, the return ring portion having an inner surface in contact with one pole of the magnet, a central core having a central passage, an access slot, and a surface in contact with the other pole of the magnet, a one-piece frame having front and rear supports for the coil and connecting portions extending through the return ring region of the outer ring member alongside the magnet, a pair of core supports extending through the frame in interlocking relation therewith at the front and rear of the magnet, the portions of the core supports extending through the frame having notches in their side margins which interlock with portions of the frame close to the magnet, the core ends having circular shoulders coaxial with the axis of said central passage, the lower ends of the core supports having circular apertures within which the circular shoulders are received, and the core supports having access slots aligned with the access slot in the core.

2. A meter movement according to claim 1 wherein the core ends have shallow annular recesses between the circular shoulders and the cylindrical end portions of the periphery of the core, the core supports having rounded lower ends received within the annular recesses in the core.

3. A meter movement according to claim 2 wherein the frame has an aperture into which the magnet fits, the frame including reentrant corner portions adjacent the magnet aperture, which corner portions engage the side slots of the core supports in interlocking relation.

4. A meter movement according to claim 3 wherein the shallow annular recesses in the core ends include oblique upper regions to receive the core supports in inwardly tilted relation during insertion into the magnet aperture in the frame.

5. A meter movement according to claim 4 wherein the upper portions of the core supports apply yielding pressure to the front and rear of the magnet block when the magnet is in place in the frame.

6. A meter movement according to claim 5 wherein the connecting portions of the frame within the return ring are torsionally twisted to provide firm contact between the pole faces, the core and the return ring.

7. A meter movement according to claim 6 wherein the torsional twisting results from the support of the outer side margins of the frame by the inward shoulders of the return ring at a level above the height of the side slots in the core supports.

* * * * *